United States Patent
Savithri et al.

(10) Patent No.: US 9,405,871 B1
(45) Date of Patent: Aug. 2, 2016

(54) DETERMINATION OF PATH DELAYS IN CIRCUIT DESIGNS

(71) Applicant: Xilinx, Inc., San Jose, CA (US)

(72) Inventors: Nagaraj Savithri, Plano, TX (US); Vinod K. Nakkala, Hyderabad (IN); Atul Srinivasan, Woodside, CA (US); Sudip K. Nag, San Jose, CA (US)

(73) Assignee: XILINX, INC., San Jose, CA (US)

( * ) Notice: Subject to any disclaimer, the term of this patent is extended or adjusted under 35 U.S.C. 154(b) by 67 days.

(21) Appl. No.: 14/562,359

(22) Filed: Dec. 5, 2014

(51) Int. Cl.
*G06F 17/50* (2006.01)

(52) U.S. Cl.
CPC ........ *G06F 17/5031* (2013.01); *G06F 17/5081* (2013.01)

(58) Field of Classification Search
CPC .................... G06F 17/5031; G06F 17/5081
USPC .................... 716/108, 113, 136; 703/16
See application file for complete search history.

(56) References Cited

U.S. PATENT DOCUMENTS

| | | | | |
|---|---|---|---|---|
| 5,491,640 A * | 2/1996 | Sharma | ............... | G06F 17/5045 716/102 |
| 5,550,748 A * | 8/1996 | Xiong | ................. | G06F 17/5077 716/129 |
| 5,726,902 A * | 3/1998 | Mahmood | ........... | G06F 17/5045 716/102 |
| 5,825,658 A * | 10/1998 | Ginetti | ................ | G06F 17/5031 716/108 |
| 5,870,309 A * | 2/1999 | Lawman | ............. | G06F 17/5054 716/102 |
| 6,097,884 A * | 8/2000 | Sugasawara | ..... | G01R 31/31707 716/102 |
| 6,205,573 B1 * | 3/2001 | Hasegawa | ........... | G06F 17/5031 716/113 |
| 6,341,363 B1 * | 1/2002 | Hasegawa | ........... | G06F 17/5031 716/108 |
| 6,414,527 B1 * | 7/2002 | Seno | ......................... | G06F 1/10 327/158 |
| 6,557,150 B1 * | 4/2003 | Honmura | ............ | G06F 17/5022 716/113 |
| 6,996,515 B1 * | 2/2006 | Foltin | .................. | G06F 17/5031 703/19 |
| 7,082,587 B2 * | 7/2006 | Chen | .................... | G06F 17/5036 716/113 |
| 7,222,036 B1 * | 5/2007 | Thorne | .............. | G01R 31/3016 327/262 |
| 7,337,100 B1 * | 2/2008 | Hutton | ................ | G06F 17/5068 703/13 |

(Continued)

FOREIGN PATENT DOCUMENTS

JP 2001325320 A * 11/2001 .............. G06F 17/50

OTHER PUBLICATIONS

Fan et al., Chinese Patent Document No. CN 101464921 A, plublished Sep. 29, 2010, front page including English absttact, 3 pages.*

*Primary Examiner* — Phallaka Kik
(74) *Attorney, Agent, or Firm* — LeRoy D. Maunu

(57) ABSTRACT

Determining delays of paths in a circuit design includes determining whether or not each path of the plurality of paths matches a path definition of a plurality of path definitions in a path database. For each path that matches a path definition, a first path delay value associated with the matching path definition is read from the path database and associated with the matching path of the circuit design. For each path that does not match any of the path definitions, respective element delay values of elements of the path are read from an element database. A second path delay value of the non-matching path is computed as a function of the respective element delay values, and the second path delay value is associated with the path. The first and second path delay values are output along with information indicating the associated paths.

20 Claims, 5 Drawing Sheets

(56) References Cited

U.S. PATENT DOCUMENTS

| | | | | |
|---|---|---|---|---|
| 8,000,951 B2 * | 8/2011 | Arayama | G06F 17/5031 | 703/19 |
| 8,117,577 B1 * | 2/2012 | Vadi | G06F 17/5031 | 703/13 |
| 8,745,561 B1 * | 6/2014 | Garg | G06F 17/5031 | 703/16 |
| 2002/0100006 A1 * | 7/2002 | Kosugi | G06F 17/5022 | 716/108 |
| 2003/0131328 A1 * | 7/2003 | Barrick | G06F 17/5031 | 716/108 |
| 2004/0049747 A1 * | 3/2004 | Yamasaki | G06F 17/5081 | 716/107 |
| 2006/0010410 A1 * | 1/2006 | Curtin | G06F 17/5031 | 716/108 |
| 2006/0184908 A1 * | 8/2006 | Minami | G03F 1/144 | 716/53 |
| 2008/0052655 A1 * | 2/2008 | Curtin | B62K 3/02 | 716/114 |
| 2008/0104563 A1 * | 5/2008 | Kosugi | G06F 17/5036 | 716/114 |
| 2008/0120585 A1 * | 5/2008 | Nozuyama | G06F 17/5081 | 716/112 |
| 2008/0263489 A1 * | 10/2008 | Canada | G01R 31/318364 | 716/113 |
| 2010/0031209 A1 * | 2/2010 | Luan | G06F 17/5031 | 716/113 |
| 2010/0095261 A1 * | 4/2010 | Ito | G06F 17/5031 | 716/113 |
| 2012/0054700 A1 * | 3/2012 | Fujiwara | G06F 17/505 | 716/103 |
| 2012/0139602 A1 * | 6/2012 | Sakata | G06F 17/5031 | 327/262 |
| 2012/0246606 A1 * | 9/2012 | Krauch | G06F 17/5031 | 716/113 |
| 2013/0152034 A1 * | 6/2013 | Tetelbaum | G06F 17/5045 | 716/113 |
| 2013/0219352 A1 * | 8/2013 | Ishikawa | G06F 17/5068 | 716/108 |
| 2013/0227506 A1 * | 8/2013 | Kocan | G06F 17/5022 | 716/108 |
| 2015/0234959 A1 * | 8/2015 | Gangadharan | G06F 17/5031 | 716/108 |
| 2015/0254384 A1 * | 9/2015 | Dumchin | G06F 17/5031 | 716/113 |

* cited by examiner

DETERMINATION OF PATH DELAYS IN CIRCUIT DESIGNS

TECHNICAL FIELD

The disclosure generally relates to determining the delays of paths in circuit designs.

BACKGROUND

Circuit designers perform timing analysis to determine whether not a design will satisfy timing requirements when implemented. Timing analysis may be either static or dynamic. Static timing analysis may entail computing the delays of signal paths in the circuit design based on the routes defined for the signals. Dynamic timing analysis may involve a simulation using the circuit design for determining the delays of the signal paths.

In one approach to static timing analysis, a placed and routed circuit design is analyzed using a standard delay library. The standard delay library has elements that correspond to particular circuit resources of an integrated circuit (IC) on which the circuit design is to be implemented. The elements in the standard library have associated delay values, and the delays of paths in the placed and routed circuit design are computed based on the components in the circuit design and matching elements and associated delay values from the standard delay library.

Static timing analysis may produce delay values that are too conservative, which may cause difficulties in closing the timing of a circuit design. Different instances of a component of an IC may have different delays depending on the location of the component on the IC, the type of another component that drives the component, and the type of the component that the component is driving, for example. The delay values in a standard delay library may reflect a worst case delay for the component of the IC that is represented by the associated element.

SUMMARY

In one embodiment, a method of determining delays in a circuit design includes inputting a circuit design to a computer processor. The circuit design has a plurality of paths, and each path has a source storage element coupled to a destination storage element through a signal route. The method determines whether or not each path of the plurality of paths matches a path definition of a plurality of path definitions in a path database. For each path of the plurality of paths that matches one of the plurality of path definitions, the method reads from the path database a path delay value associated with the one path definition. The path delay value from the path database is associated with the path. For each path of the plurality of paths that does not match any of the plurality of path definitions, the method reads respective element delay values of elements of the path from an element database and computes a path delay value of the path as a function of the respective element delay values. The computed path delay value is associated with the path. Each path delay value read from the path database and each computed path delay value are output along with information indicating the associated paths.

In another embodiment, a system includes a processor arrangement and a memory coupled to the processor arrangement. The memory is configured with instructions that are executable by the processor arrangement for determining delays in a circuit design. The instructions when executed by the processor arrangement cause the processor arrangement to perform operations including inputting a circuit design having a plurality of paths. Each path has a source storage element coupled to a destination storage element through a signal route. The operations include determining whether or not each path of the plurality of paths matches a path definition of a plurality of path definitions in a path database. For each path of the plurality of paths that matches one of the plurality of path definitions, the instructions cause the processor arrangement to read from the path database a path delay value associated with the one path definition. The path delay value from the path database is associated with the path. For each path of the plurality of paths that does not match any of the plurality of path definitions, the instructions cause the processor arrangement to read respective element delay values of elements of the path from an element database and compute a path delay value of the path as a function of the respective element delay values. The computed path delay value is associated with the path. Each path delay value read from the path database and each computed path delay value are output along with information indicating the associated paths.

Other features will be recognized from consideration of the Detailed Description and Claims, which follow.

BRIEF DESCRIPTION OF THE DRAWINGS

Various aspects and features of the method and system will become apparent upon review of the following detailed description and upon reference to the drawings, in which.

DETAILED DESCRIPTION

Figure 1:
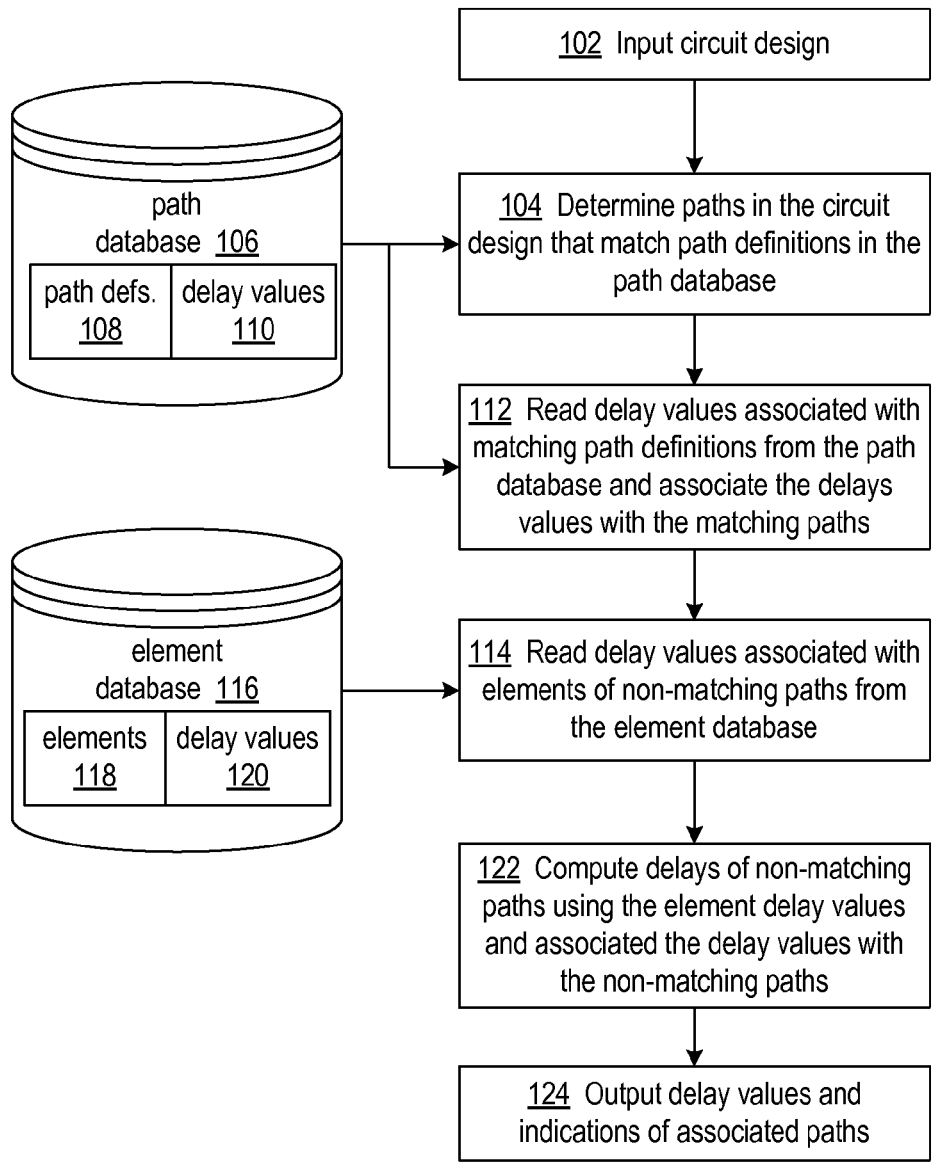
FIG. 1 is a flowchart of a process for determining delays of paths in a circuit design.

In the following description, numerous specific details are set forth to describe specific examples presented herein. It should be apparent, however, to one skilled in the art, that one or more other examples and/or variations of these examples may be practiced without all the specific details given below. In other instances, well known features are not described in detail so as not to obscure the description of the examples herein. For ease of illustration, the same reference numerals may be used in different diagrams to refer to the same elements or additional instances of the same element.

The disclosed methods and systems use a path database in combination with an element database to determine the delays of signal paths in a circuit design. The path database has definitions of paths and delay values associated with the path definitions, and the element database identifies circuit resources and associated delay values. The path definitions may define paths that frequently appear in circuit designs. The delay values associated with the path definitions may be determined through testing of implementations of circuit designs having paths that match the path definitions. The path database provides an improvement in the accuracy of the timing analysis and may decrease the time required to complete the analysis. The delay values in the path database are more accurate than the delay values in the element database, because each delay value in the element database may represent a worst case delay of different possible delays for different instances of the same circuit element. The time required to complete the timing analysis may be reduced, because the total delay for a path of the circuit design that matches a path definition may be read from the path database rather than computed using individual delay values from the element database.

A circuit design to be analyzed has multiple paths, and each path has a source storage element coupled to a destination storage element through a signal route. Each path in the circuit design is matched against the path definitions in the path database. For each path that matches one of the path definitions, the associated path delay value is read from the path database, and the path delay value is associated with the path. For each path that does not match any of the path definitions, the delay of the path is computed using the element database. Respective element delay values of elements of the path are read from the element database, and a path delay value of the path computed as a function of the respective element delay values. The computed path delay value is associated with the non-matching path. The delay values of the paths and information identifying the associated paths are output, such as to a storage arrangement, a display screen, or to a computer program for further processing.

FIG. 1 is a flowchart of a process for determining delays of paths in a circuit design. At block 102, a circuit design is input for analysis. The circuit design includes multiple signal paths, and each signal path includes a source storage element, a signal route, and a destination storage element. The storage elements may be flip flops or latches, for example, and the signal route may include signal lines and possibly one or more logic gates of combinational logic.

At block 104, the process determines, for each path in the circuit design, whether or not the path matches a path definition in the path database 106. The path database 106 includes path definitions 108 and associated delay values 110. That is, there is a respective delay value associated with each path definition. Each path definition specifies particular circuit elements or components of an IC. The particular circuit elements are specific instances of elements at specific locations on the IC. The elements in a path definition may include specific instances of storage elements, signal lines, and logic gates, for example. In a programmable IC having programmable logic and routing, the logic gates may be lookup tables, and the signal lines may be programmable routing resources, for example. The delay values associated with the path definitions may have been previously determined through testing of implementations of other circuit designs having paths that match the path definitions.

In determining whether or not a path of the circuit design matches a path definition in the path database, the process compares elements of the path to the elements in the path definitions. If all the elements in a path match all the elements in a path definition, and the elements in the path and the path definition are in the same order, the path is determined to match the path definition. For each path that matches a path definition (a "matching path"), the associated delay value is read from the path database at block 112.

For each path of the input circuit design that does not match any of the path definitions 108 in the path database 106 (a "non-matching path"), at block 114, the process reads delay values associated with the elements of the non-matching paths from the element database 116. The element database specifies elements 118 of an IC and associated delay values 120. Each element has a respective associated delay value. The delay values associated with the elements may be worst case delays. That is, different instances of a particular element of the IC may have different delays, and the delay value associated with the element in the element database is the greatest of the delays. The elements in the element database may include storage elements, signal lines, and logic gates, for example. In a programmable IC having programmable logic and routing, the logic gates may be lookup tables, and the signal lines may be programmable routing resources, for example. The delay values may be associated with the matching paths such as with a data structure that establishes a correspondence between the delay values and the paths with which the delay values are associated.

At block 122, the delays of the non-matching paths are computed using the delay values read from the element database 116. The delay of a non-matching path is the sum of delay values read from the element database for the elements of the path. The computed delay values may be associated with the non-matching paths.

In an example implementation, the processing of blocks 104 and 112 is performed before the processing of blocks 114 and 112. That is, the process determines whether or not paths of the circuit design match the path definitions before delay values are computed using the element database 116. Performance of the timing analysis may be thereby improved, because the matching of paths to path definitions may accomplished with a depth-first search of a graph representing paths and elements of the circuit design rather than a bread-first search that tags elements with delay values from the element database.

At block 124, the delay values are output along with data that indicate the paths of the circuit design with which the delay values are associated. Depending on the application, the data may be output to a storage device, to a display screen, or to another process for further processing.

Figure 2:
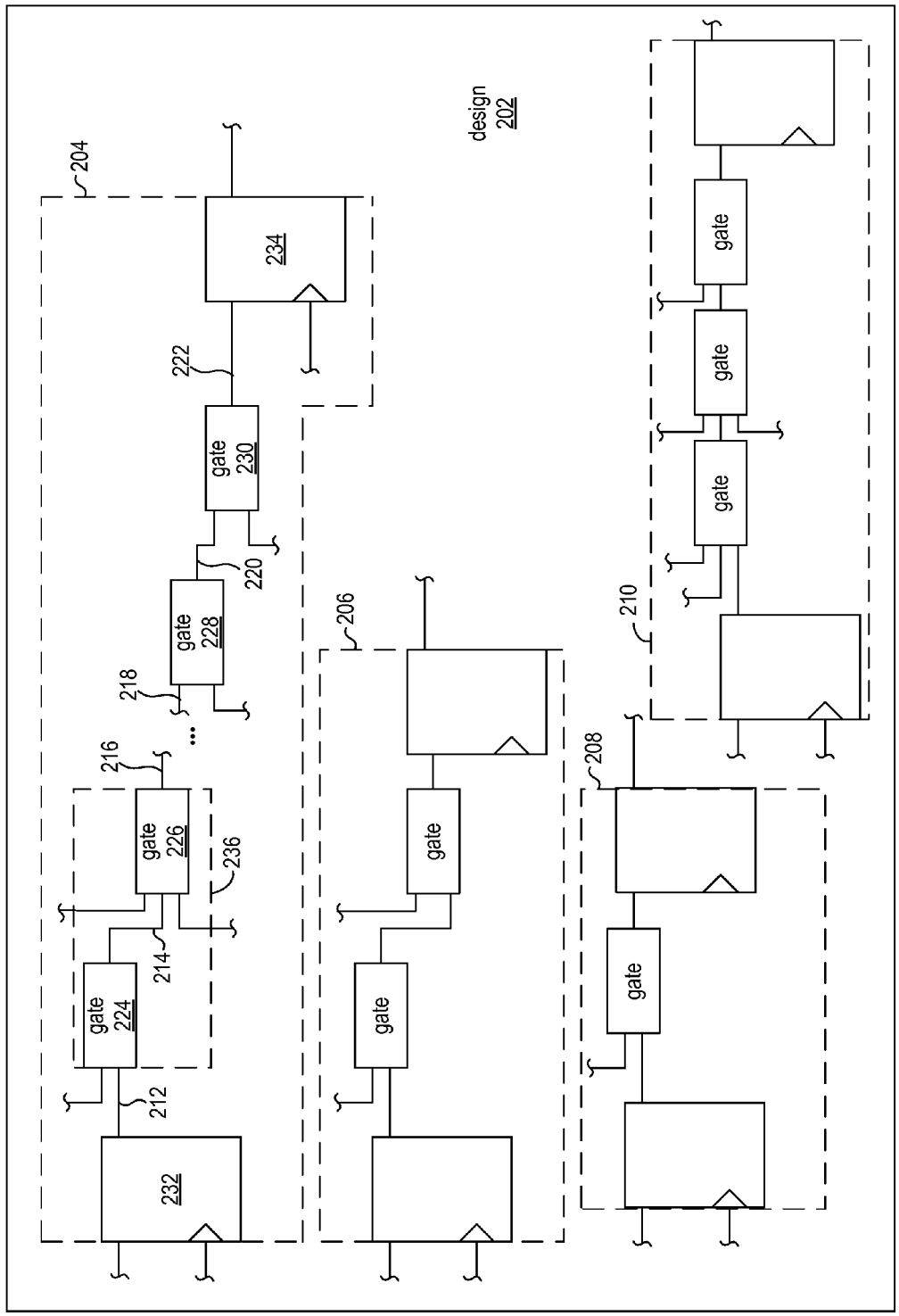
FIG. 2 is a block diagram that illustrates a circuit design, along with examples of paths in the circuit design.

FIG. 2 is a block diagram that illustrates a circuit design 202, along with example paths 204, 206, 208, and 210 in the circuit design. It will be recognized that the circuit design 202 may have many additional circuit paths, which are not shown, and interconnections between the paths, which are also not shown. Each path includes one or more circuit elements, with each element being a circuit component to which an individual delay value may be assigned, such as in the element database 116 of FIG. 1. For example, path 204 is shown as having signal route elements and logic gate elements. Lines 212, 214, 216, 218, 220, and 222 are examples of signal route elements, and logic gates 224, 226, 228, and 230 are examples of gate elements. The storage elements 232 and 234 are the terminal ends of the path 204. Thus, path 204 includes the elements 232, 212, 224, 214, 226, 216, ..., 218, 228, 220, 230, 222, and 234, in that order. The ellipsis represents additional elements of the path that are not illustrated.

Figure 3:
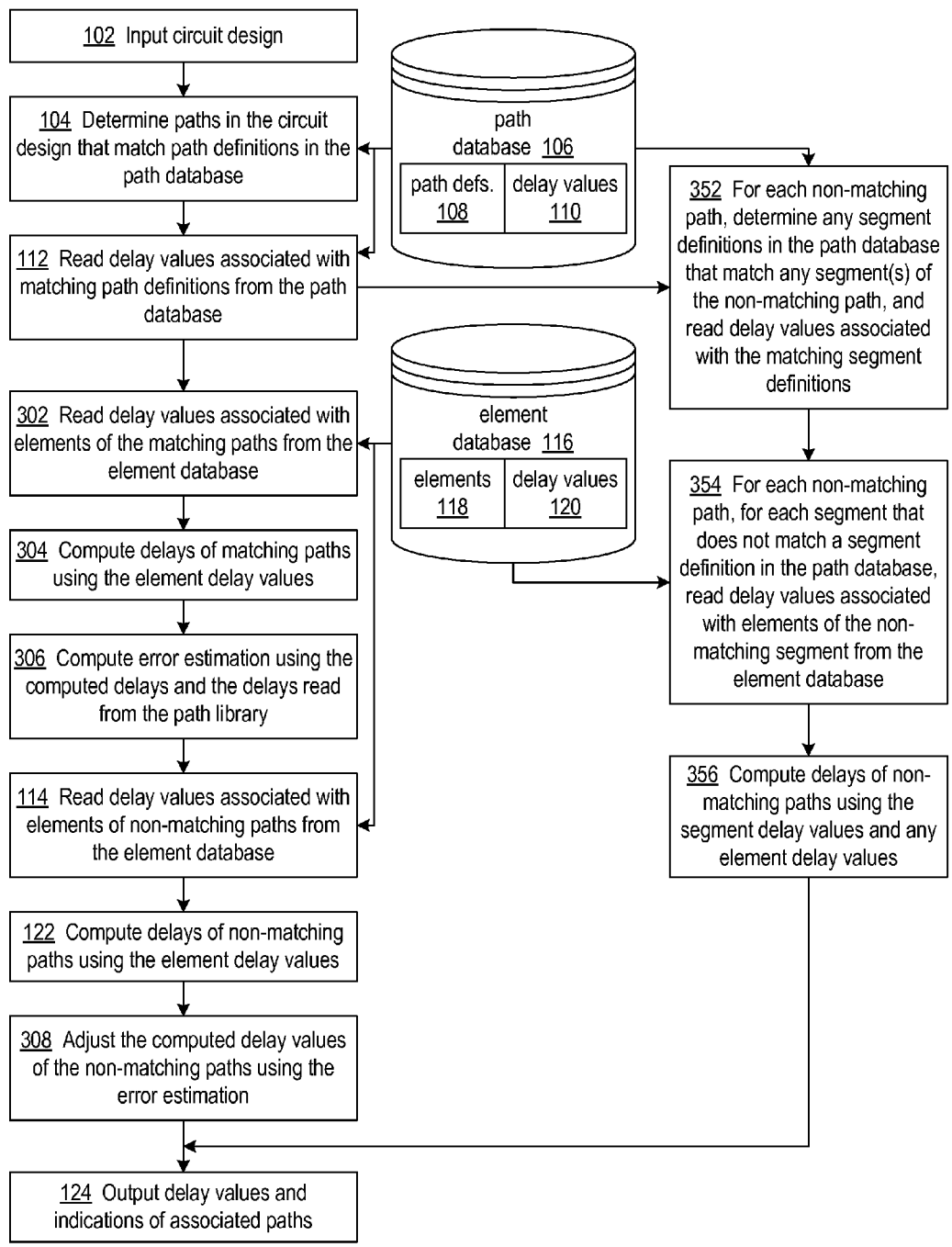
FIG. 3 is a flowchart of another process for determining delays of paths in a circuit design.

As shown in FIG. 3 and described below, segments of paths may also be used to improve timing analysis. The path database may include segment definitions for matching with segments of paths, and the segment definitions may have associated delay values that indicate the delays introduced by the segments. An example of a segment 236 of path 204 may include elements 224, 214, and 226.

The delay values associated with the segment definitions in the path database 106 may be determined, for example, by generating a respective ring oscillator circuit design for desired circuit segments. The ring oscillator circuit design has a source gate that is connected to a destination gate by a net and a feedback path that connects an output pin of the destination gate to an input pin of the source gate. Configuration data may be generated from the ring oscillator circuit design to implement respective ring oscillator circuits. The configuration data implement each ring oscillator circuit on a programmable IC. Each ring oscillator circuit may then be individually tested to determine respective signal delays.

FIG. 3 is a flowchart of another process for determining delays of paths in a circuit design. The process of FIG. 3 employs additional processing for determining delays of paths of the circuit design that do not match path definitions in the path database. Two types of additional processing may be performed for the unmatched paths. One type of additional processing entails determining an error estimation based on the delay values of matching paths and computed delay values for the matching paths, and using that error estimation in adjusting the computed delay value of the unmatched path (blocks 302, 304, 306). The error estimation may be optional and enabled by the designer performing the analysis. The other type of additional processing entails matching segments of the unmatched path to segment definitions in the path library and computing a delay value for a path based on segment delay values and element delay values (blocks 352, 354, and 356). The approaches may be used alone or in combination with one another.

The processing of blocks 102, 104, and 112 proceeds as described above in the description of FIG. 1. At block 302, for the paths that match path definitions in the path database 106, the process reads from the element database 116 the delay values associated with the elements of the matching paths. The delays of the matching paths are computed at block 304 using the delay values of the matching path elements read from the element database. Blocks 112 and 304 thereby provide an actual delay value of a matching path as provided by the path database, and a worst case delay value as computed from the delay values from the element database. At block 306, an error estimation is computed as a function of the actual delay values and the computed delay values. For example, the error estimation may be based on an average of the differences between the computed delay values and the actual delay values. The differences may be expressed as percentages. For example, for n matching paths in a circuit design, where $Da_i$ is the actual delay value of path i, and $Dc_i$ is the computed delay value of path i, the error estimation may computed as:

$$\frac{\left(\sum_{i=1}^{n}\left(\frac{Da_i}{Dc_i}\right)*100\right)}{n}$$

At block 114, the process reads delay values associated with the elements of the non-matching paths from the element database 116. At block 122, the delays of the non-matching paths are computed using the delay values read from the element database 116. The delay of a non-matching path is the sum of delay values read from the element database for the elements of the path.

The computed delay values of the non-matching paths are adjusted at block 308 using the error estimation computed at block 306. Since the error estimation from block 308 is expressed as a percentage, the computed delay values may be reduced by multiplying the error estimation and the computed delay values. At block 124, the delay values are output along with data that indicate the paths of the circuit design with which the delay values are associated.

Predetermined delays of path segments may also be used to improve timing analysis. That is, the path database 106 may have definitions of portions of paths in the path definitions 108. The definition of a portion of a path may be referred to as a segment definition. Each segment definition has an associated delay value in the delay values 110. The delay values associated with the segment definitions may have been previously determined through testing of implementations of other circuit designs having segments that match the segment definitions. At blocks 352, 354, and 356, the process uses a combination of delay values associated with segment definitions and delay values from the element database 116 to compute a delay values for non-matching paths.

Each segment definition specifies particular circuit elements or components of an IC. The particular circuit elements are specific instances of elements at specific locations on the IC. The elements in a segment definition may include specific instances of storage elements, signal lines, and logic gates, for example. In a programmable IC having programmable logic and routing, the logic gates may be lookup tables, and the signal lines may be programmable routing resources, for example. Unlike a path definition, a segment definition need not be terminated with storage elements at the source and destination. At block 352, for each non-matching path of the circuit design, the process determines whether or not any portion of the path matches any of the segment definitions. In determining whether or not a portion of a path of the circuit design matches a segment definition in the path database, the process compares elements of the segment to the elements in the segment definitions. If all the elements in a segment match all the elements in a segment definition, and the elements in the segment and the segment definition are in the same order, the segment is determined to match the segment definition. For each segment that matches a segment definition, the associated delay value is read from the path database at block 352.

At block 354, the process reads delay values from the element database 116 for portions of the non-matching path that did not match any of the segment definitions in the path database 106. For each non-matching path having a portion that matches a segment definition(s), a delay value is computed using a combination of the delay value(s) associated with the matching segment definition(s) and delay values read from the element database for non-matching portions of the path at block 356. The computed delay value is associated with the non-matching path.

Figure 4:
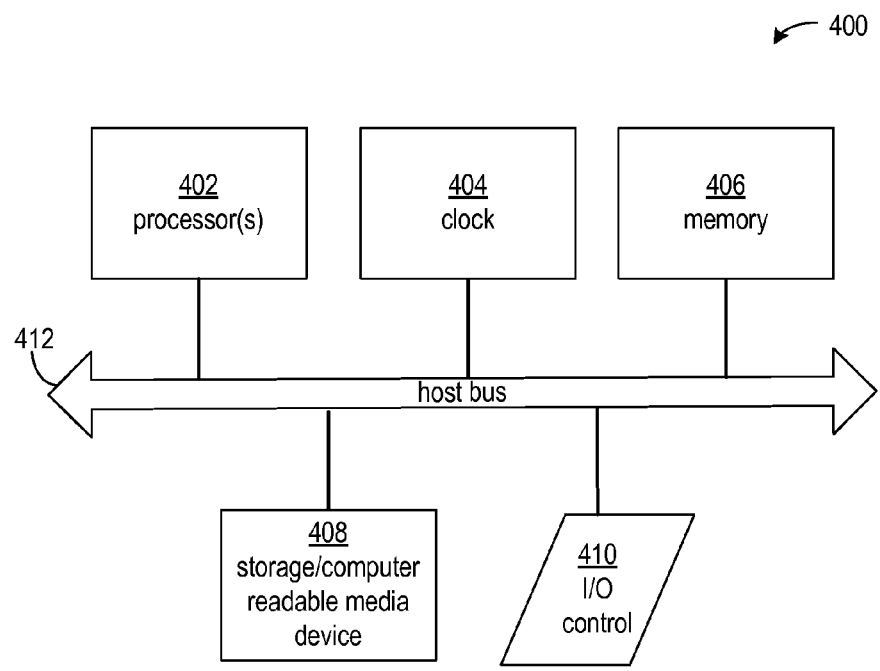
FIG. 4 shows a block diagram of an example computing arrangement that may be configured to implement the data structures and processes described herein.

FIG. 4 shows a block diagram of an example computing arrangement that may be configured to implement the data structures and processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 400 includes one or more processors 402, a clock signal generator 404, a memory arrangement 406, a storage arrangement 408, and an input/output control unit 410, all coupled to a host bus 412. The arrangement 400 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 402 may be one or more general purpose processors, or a combination of one or more general purpose processors and suitable co-processors, or one or more specialized processors (e.g., RISC, CISC, pipelined, etc.).

The memory arrangement 406 typically includes multiple levels of cache memory, and a main memory. The storage arrangement 408 may include local and/or remote persistent storage, such as provided by magnetic disks (not shown), flash, EPROM, or other non-volatile data storage. The storage unit may be read or read/write capable. Further, the memory arrangement 406 and storage arrangement 408 may be combined in a single arrangement.

The processor(s) 402 executes the software in storage arrangement 408 and/or memory arrangement 406, reads data from and stores data to the storage arrangement 408 and/or memory arrangement 406, and communicates with external devices through the input/output control arrangement 410. These functions are synchronized by the clock signal generator 404. The resource of the computing arrangement may be managed by either an operating system (not shown), or a hardware control unit (not shown).

Figure 5:
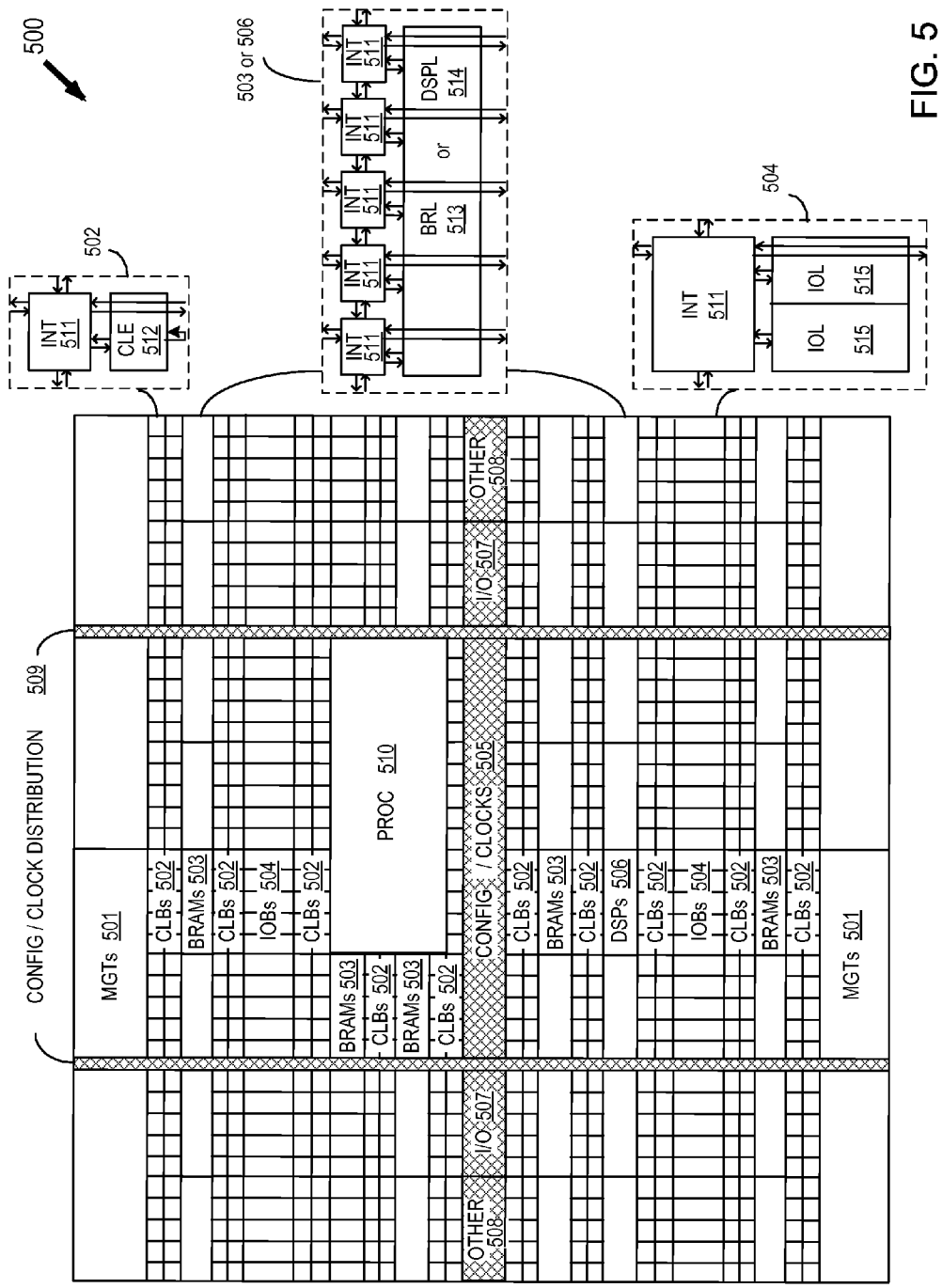
FIG. 5 shows a programmable integrated circuit (IC) on which a circuit design to be analyzed may be implemented.

FIG. 5 shows a programmable integrated circuit (IC) 500 on which a circuit design to be analyzed may be implemented. The programmable IC may also be referred to as a System On Chip (SOC) that includes field programmable gate array logic (FPGA) along with other programmable resources. Though an SOC having FPGA logic is shown as an exemplary target device for a circuit design, it will be recognized that the disclosed methods and systems may be suitable for analyzing circuit designs that are targeted to other types of target devices such as application specific ICs (ASICs) and complex programmable logic devices (CPLDs). FPGA logic may include several different types of programmable logic blocks in the array. For example, FIG. 5 illustrates programmable IC 500 that includes a large number of different programmable tiles including multi-gigabit transceivers (MGTs) 501, configurable logic blocks (CLBs) 502, random access memory blocks (BRAMs) 503, input/output blocks (IOBs) 504, configuration and clocking logic (CONFIG/CLOCKS) 505, digital signal processing blocks (DSPs) 506, specialized input/output blocks (I/O) 507, for example, clock ports, and other programmable logic 508 such as digital clock managers, analog-to-digital converters, system monitoring logic, and so forth. Some programmable IC having FPGA logic also include dedicated processor blocks (PROC) 510 and internal and external reconfiguration ports (not shown).

In some FPGA logic, each programmable tile includes a programmable interconnect element (INT) 511 having standardized connections to and from a corresponding interconnect element in each adjacent tile. Therefore, the programmable interconnect elements taken together implement the programmable interconnect structure for the illustrated FPGA logic. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic, plus a single programmable interconnect element INT 511. A BRAM 503 can include a BRAM logic element (BRL) 513 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 506 can include a DSP logic element (DSPL) 514 in addition to an appropriate number of programmable interconnect elements. An IOB 504 can include, for example, two instances of an input/output logic element (IOL) 515 in addition to one instance of the programmable interconnect element INT 511. As will be clear to those of skill in the art, the actual I/O bond pads connected, for example, to the I/O logic element 515, are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 5 include additional logic blocks that disrupt the regular columnar structure making up a large part of the programmable IC. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and system are thought to be applicable to a variety of systems for analyzing circuit designs. Other aspects and features will be apparent to those skilled in the art from consideration of the specification. It is intended that the specification and drawings be considered as examples only, with a true scope of the invention being indicated by the following claims.

What is claimed is:

1. A method of determining delays, comprising:
performing on a computer processor, operations including:
inputting a circuit design having a plurality of paths, each path having a source storage element coupled to a destination storage element through a signal route;
determining whether or not each path of the plurality of paths matches a path definition of a plurality of path definitions in a path database;
for each path of the plurality of paths that matches one of the plurality of path definitions, reading from the path database a first path delay value associated with the one path definition and associating the first path delay value from the path database with the path;
for each path of the plurality of paths that does not match any of the plurality of path definitions:
reading respective element delay values of elements of the path from an element database; and
computing a second path delay value of the path as a function of the respective element delay values and associating the second path delay value with the path; and outputting each first path delay value, each second path delay value and information indicating the associated paths.

2. The method of claim 1, wherein the determining whether or not each path of the plurality of paths matches a path definition includes comparing elements and connections between elements in the path to path definitions of the plurality of path definitions.

3. The method of claim 2, wherein the elements in each path include a plurality of routing resources and a plurality of logic gates.

4. The method of claim 3, wherein the element database includes respective delay values associated with routing resources and logic gates.

5. The method of claim 4, wherein the respective delay values associated with routing resources and logic gates in the element database are worst case values.

6. The method of claim 1, further comprising:
for each path of the plurality of paths that matches one of the plurality of path definitions, computing a third path delay value from the delay values of elements in the delay library;
computing an error estimation as a function of each first path delay value and each third path delay value; and
for one or more of the paths that does not match any of the plurality of path definitions, reducing the second path delay value as a function of the error estimation.

7. The method of claim 6, wherein the determining whether or not each path of the plurality of paths matches a path definition includes comparing elements and connections between elements in the path to path definitions of the plurality of path definitions.

8. The method of claim 7, wherein the elements in each path include a plurality of routing resources and a plurality of logic gates.

9. The method of claim 8, wherein the element database includes respective delay values associated with routing resources and logic gates.

10. The method of claim 9, wherein the respective delay values associated with routing resources and logic gates in the element database are worst case values.

11. The method of claim 1, wherein the path database further includes segment definitions, and each segment definition has an associated segment delay value and specifies one or more routing resources and one or more logic gates, the method further comprising:
for each path of the plurality of paths having one or more segments that match one or more of the segment definitions in the path database:
reading from the path database a respective segment delay value associated with each of the one or more segment definitions;
reading from the element database respective element delay values of elements in each segment of the path that does not match a segment definition in the path database;
computing a third path delay value of the path as a function of each respective segment delay value and each respective element delay value, and associating the third path delay value with the path; and
outputting the third path delay value and information indicating the associated path.

12. The method of claim 11, wherein the determining whether or not each path of the plurality of paths matches a path definition includes comparing elements and connections between elements in the path to path definitions of the plurality of path definitions.

13. The method of claim 12, wherein the elements in each path include a plurality of routing resources and a plurality of logic gates.

14. The method of claim 13, wherein the element database includes respective delay values associated with routing resources and logic gates.

15. The method of claim 14, wherein the respective delay values associated with routing resources and logic gates in the element database are worst case values.

16. The method of claim 1, wherein the determining whether or not each path of the plurality of paths matches a path definition of the plurality of path definitions in the path database is performed before the computing of the path delay values.

17. A system, comprising:
a processor arrangement;
a memory coupled to the processor arrangement, wherein the memory is configured with instructions that are executable by the processor arrangement for determining delays in a circuit design, and the instructions when executed by the processor arrangement cause the processor arrangement to perform operations including:
inputting a circuit design having a plurality of paths, each path having a source storage element coupled to a destination storage element through a signal route;
determining whether or not each path of the plurality of paths matches a path definition of a plurality of path definitions in a path database;
for each path of the plurality of paths that matches one of the plurality of path definitions, reading from the path database a path delay value associated with the one path definition and associating the path delay value from the path database with the path;
for each path of the plurality of paths that does not match any of the plurality of path definitions:
reading respective element delay values of elements of the path from an element database; and
computing a second path delay value of the path as a function of the respective element delay values and associating the second path delay value with the path; and
outputting each path delay value read from the path database and each second path delay value and information indicating the associated paths.

18. The system of claim 17, wherein the memory is further configured with instructions that when executed by the processor arrangement cause the processor arrangement to perform operations including:
for each path of the plurality of paths that matches one of the plurality of path definitions computing a third path delay value from the delay values of elements in the delay library;
computing an error estimation as a function of each first path delay value and each third path delay value; and
for one or more of the paths that does not match any of the plurality of path definitions, reducing the second path delay value as a function of the error estimation.

19. The system of claim 17, wherein the path database further includes segment definitions, and each segment definition has an associated segment delay value and specifies one or more routing resources and one or more logic gates, and the memory is further configured with instructions that when executed by the processor arrangement cause the processor arrangement to perform operations including:
for each path of the plurality of paths having one or more segments that match one or more of the segment definitions in the path database:

reading from the path database a respective segment delay value associated with each of the one or more segment definitions;

reading from the element database respective element delay values of elements in each segment of the path that does not match a segment definition in the path database;

computing a third path delay value of the path as a function of each respective segment delay value and each respective element delay value, and associating the third path delay value with the path; and outputting the third path delay value and information indicating the associated path.

20. The system of claim 17, wherein:

the instructions for determining whether or not each path of the plurality of paths matches a path definition include instructions for comparing elements and connections between elements in the path to path definitions of the plurality of path definitions;

the elements in each path include a plurality of routing resources and a plurality of logic gates; and the element database includes respective delay values associated with routing resources and logic gates.

\* \* \* \* \*